(12) United States Patent
Kojima et al.

(10) Patent No.: US 11,699,606 B2
(45) Date of Patent: Jul. 11, 2023

(54) CUTTING APPARATUS

(71) Applicant: DISCO CORPORATION, Tokyo (JP)

(72) Inventors: Yoshimasa Kojima, Tokyo (JP); Jun Nakama, Tokyo (JP); Satoshi Hanajima, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 341 days.

(21) Appl. No.: 17/215,118

(22) Filed: Mar. 29, 2021

(65) Prior Publication Data
US 2021/0313208 A1 Oct. 7, 2021

(30) Foreign Application Priority Data

Apr. 2, 2020 (JP) ................................. 2020-066791

(51) Int. Cl.
*H01L 21/67* (2006.01)
*H01L 21/687* (2006.01)
(52) U.S. Cl.
CPC .. *H01L 21/67288* (2013.01); *H01L 21/67092* (2013.01); *H01L 21/68764* (2013.01)
(58) Field of Classification Search
CPC ... B26D 1/141; H01L 21/67092; H01L 21/78; H01L 21/12; H01L 21/67288; H01L 21/68764
See application file for complete search history.

(56) References Cited

U.S. PATENT DOCUMENTS

| 5,321,352 | A * | 6/1994 | Takebuchi | G01R 1/07314 324/750.19 |
| 11,393,709 | B2 * | 7/2022 | Masuda | H01L 21/67242 |
| 2016/0125591 | A1 * | 5/2016 | Kudo | G06T 7/001 382/141 |
| 2018/0211852 | A1 * | 7/2018 | Ban | H01L 21/67092 |
| 2019/0035689 | A1 * | 1/2019 | Yamamoto | H01L 21/3043 |
| 2019/0318948 | A1 * | 10/2019 | Che | H01L 21/67748 |
| 2019/0389091 | A1 * | 12/2019 | Chen | H01L 21/67028 |
| 2019/0392574 | A1 * | 12/2019 | Iwase | G06T 7/0004 |
| 2020/0058524 | A1 * | 2/2020 | Sekiya | H01L 21/67253 |
| 2022/0018789 | A1 * | 1/2022 | Tseng | G01N 21/8803 |
| 2022/0219263 | A1 * | 7/2022 | Hadano | B23K 26/402 |
| 2022/0415673 | A1 * | 12/2022 | Otsuka | H01L 21/67092 |
| 2023/0005792 | A1 * | 1/2023 | Wakahara | B23K 26/08 |

FOREIGN PATENT DOCUMENTS

JP 2010087141 A 4/2010

OTHER PUBLICATIONS

Office Action issued in counterpart German patent application No. 10 2021 203 272.9, dated Feb. 8, 2023.

* cited by examiner

*Primary Examiner* — Omar Flores Sanchez
(74) *Attorney, Agent, or Firm* — Greer Burns & Crain Ltd.

(57) ABSTRACT

A cutting apparatus includes a table including a support plate transparent in a visible region, a cutting unit, a first feeding mechanism that includes a first moving section for supporting the table and a first motor, a second feeding mechanism that includes a second moving section for supporting the cutting unit and a second motor, a first camera disposed on the side of a first surface of the support plate, a second camera disposed on the side of a second surface opposite to the first surface of the support plate, and a storage section that stores positional deviation amounts in the X-axis direction and the Y-axis direction between an imaging region at a reference position of the first camera and an imaging region at a reference position of the second camera.

6 Claims, 10 Drawing Sheets

CUTTING APPARATUS

BACKGROUND OF THE INVENTION

Field of the Invention

The present invention relates to a cutting apparatus to be used when processing a plate-shaped workpiece.

Description of the Related Art

At the time of dividing a plate-shaped workpiece represented by a semiconductor wafer into a plurality of chips, for example, a cutting apparatus with an annular cutting blade mounted thereto is used. While causing the cutting blade rotated at high speed to cut into the workpiece, the cutting blade and the workpiece are moved relative to each other, whereby the workpiece can be processed (cut) along the routes of the movement into a plurality of chips.

In the aforementioned cutting apparatus, the workpiece before processing is often imaged by a camera located above to acquire an image. On the basis of the image thus acquired, the positional relation between a table supporting the workpiece and the cutting blade is adjusted, whereby the cutting blade can be caused to cut into streets set on the workpiece.

This camera is also used at the time of, for example, confirming the position of a kerf formed in the workpiece and the size of chipping generated in the kerf and the like. By processing the workpiece while confirming the position of the kerf and the size of chipping, on the basis of the image obtained by the camera, defects arising from processing can be found early and the yield of the chips obtained can be enhanced.

Incidentally, at the time of dividing the workpiece into a plurality of chips by the aforementioned cutting apparatus, it is possible that a defect, what is called an oblique cut, may be generated in which the position of the upper end of the kerf exposed at an upper surface of the workpiece and the position of the lower end of the kerf exposed at a lower surface of the workpiece are deviated from each other. This oblique cut is detected, for example, a method of observing the obtained chip from a lateral side.

In recent years, it has been investigated to detect the oblique cut by use of a processing apparatus (see, for example, Japanese Patent Laid-open No. 2010-87141) that includes a transparent table and a camera disposed under the table, in addition to the camera located above. The upper surface and the lower surface of the workpiece are imaged by the two cameras, and the deviation between the position of the upper end of the kerf and the position of the lower end of the kerf is detected, whereby an oblique cut can be found early.

SUMMARY OF THE INVENTION

However, in the aforementioned conventional processing apparatus, when there is a deviation between the position of the imaging region of the camera located above and the position of the imaging region of the camera located below, the deviation between the position of the upper end of the kerf and the position of the lower end of the kerf cannot be detected properly. As a result, it may be difficult to find the oblique cut.

Accordingly, it is an object of the present invention to provide a cutting apparatus in which a region imaged by one of two cameras can be securely imaged by the other of the two cameras.

In accordance with an aspect of the present invention, there is provided a cutting apparatus including: a table that includes a support plate transparent in a visible region and supports a plate-shaped workpiece by the support plate; a cutting unit that includes a spindle for mounting an annular blade thereto and cuts the workpiece supported by the table; a first feeding mechanism that includes a first moving section for supporting the table and a first motor for moving the first moving section in an X-axis direction; a second feeding mechanism that includes a second moving section for supporting the cutting unit and a second motor for moving the second moving section in a Y-axis direction; a first camera that is disposed on a side of a first surface supporting the workpiece of the support plate; a second camera that is disposed on a side of a second surface opposite to the first surface of the support plate; and a storage section that stores positional deviation amounts in the X-axis direction and the Y-axis direction between an imaging region at a reference position of the first camera and an imaging region at a reference position of the second camera, in which the positional relation between the first camera or the second camera and the table is adjusted on the basis of the deviation amounts recorded in the storage section, whereby a region imaged by one of the first camera and the second camera is capable of being imaged by the other of the first camera and the second camera.

In the aspect of the present invention as above, the table may be provided with a deviation amount calculation mark to be used for calculating the deviation amounts, and the deviation amounts calculated on the basis of an image obtained by imaging a region including the deviation amount calculation mark by the first camera and an image obtained by imaging a region including the deviation amount calculation mark by the second camera may be stored in the storage section.

In addition, in the aspect of the present invention as above, the cutting apparatus may further include a third feeding mechanism that includes a third moving section and a third motor for moving the third moving section in the Y-axis direction, the first camera may be supported by the second moving section, and the second camera may be supported by the third moving section.

Besides, in the aspect of the present invention as above, the first camera and the second camera may be supported by the second moving section.

The cutting apparatus according to the aspect of the present invention includes the storage section that stores the positional deviation amounts in the X-axis direction and the Y-axis direction between the imaging region at a reference position of the first camera and the imaging region at a reference position of the second camera; therefore, by adjusting the positional relation between the first camera or the second camera and the table on the basis of the deviation amounts recorded in the storage section, a region imaged by one of the first camera and the second camera can be securely imaged by the other of the first camera and the second camera.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 3 is a perspective view depicting a configuration example of a workpiece and the like;

DETAILED DESCRIPTION OF THE PREFERRED EMBODIMENT

Figure 1:
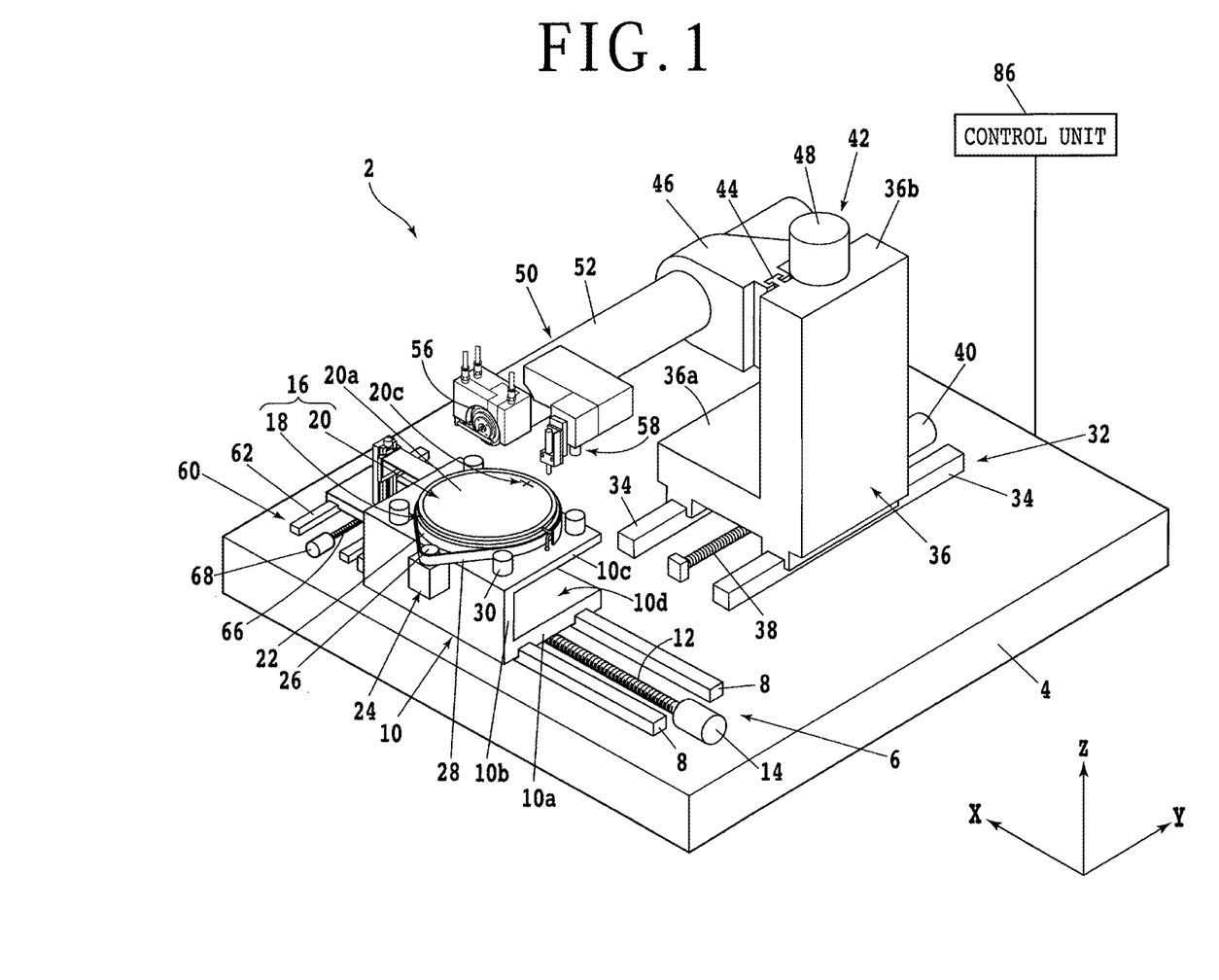
FIG. 1 is a perspective view depicting a configuration example of a cutting apparatus.

An embodiment of the present invention will be described below referring to the attached drawings. FIG. 1 is a perspective view depicting a configuration example of a cutting apparatus 2 according to the present embodiment. Note that, in FIG. 1, some components of the cutting apparatus 2 are depicted in the form of functional blocks. In addition, an X-axis direction (processing feeding direction), a Y-axis direction (indexing feeding direction), and a Z-axis direction (vertical direction) used in the following description are orthogonal to one another.

As illustrated in FIG. 1, the cutting apparatus 2 includes a base 4 that supports each component. A ball screw type X-axis moving mechanism (first feeding mechanism, processing feeding mechanism) 6 is disposed on an upper surface of the base 4. The X-axis moving mechanism 6 includes, for example, a pair of X-axis guide rails 8 fixed to the upper surface of the base 4 and substantially parallel to the X-axis direction. An X-axis moving section (first moving section) 10 is attached to the X-axis guide rails 8 such as to be slidable in the X-axis direction.

Figure 2:
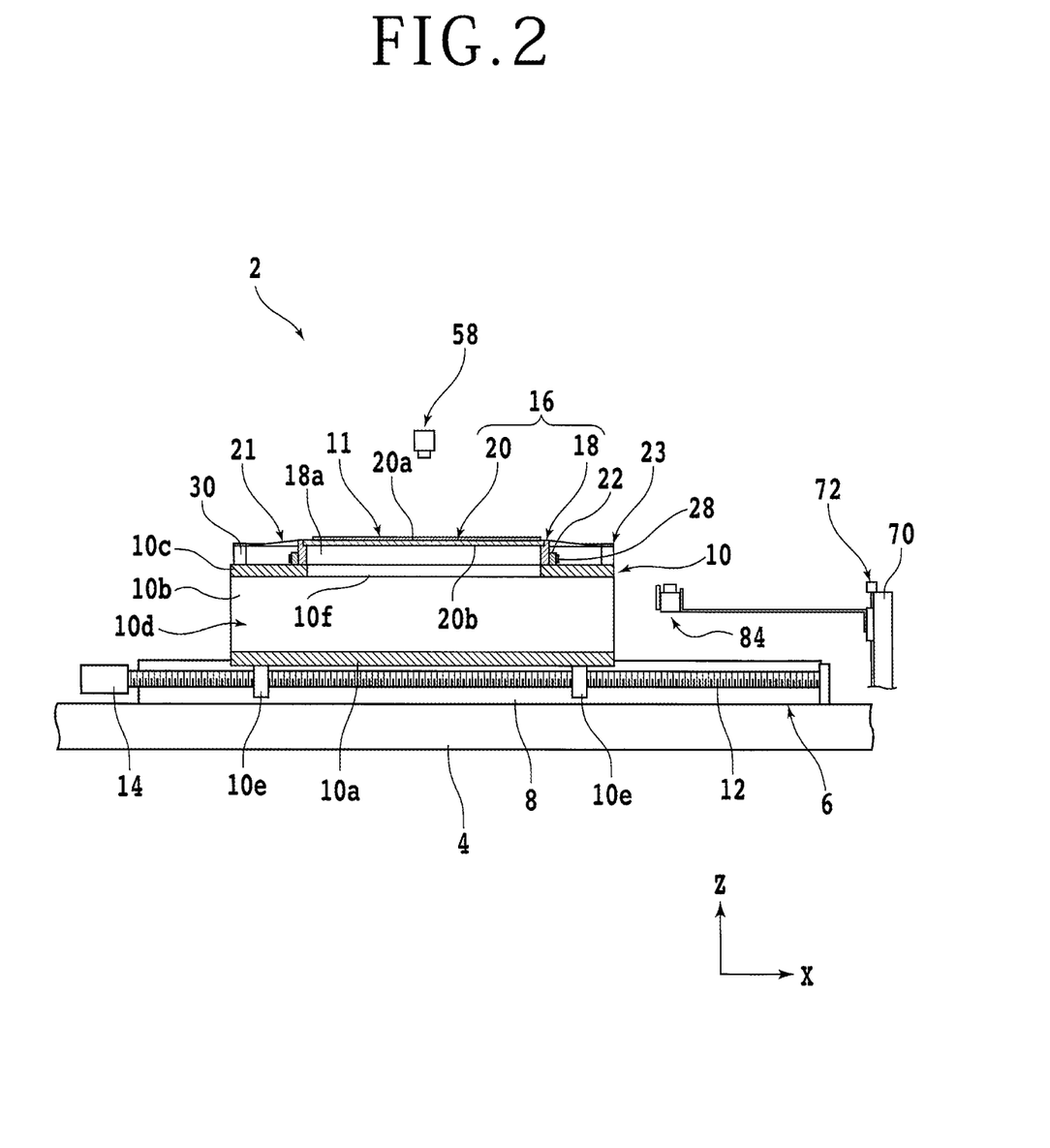
FIG. 2 is a sectional view depicting a part of the cutting apparatus.

FIG. 2 is a sectional view depicting a part of the cutting apparatus 2. As depicted in FIGS. 1 and 2, the X-axis moving section 10 includes a flat plate-shaped bottom plate section 10a which is rectangular in shape as viewed in the Z-axis direction. A lower end of a flat plate-shaped side plate section 10b which is rectangular in shape as viewed in the Y-axis direction is connected to one end side in the Y-axis direction of the bottom plate section 10a.

One end in the Y-axis direction of a flat plate-shaped top plate section 10c which is rectangular like the bottom plate section 10a in shape as viewed from the Z-axis direction is connected to an upper end of the side plate section 10b. In other words, one end in the Y-axis direction of the bottom plate section 10a and one end in the Y-axis direction of the top plate section 10c are connected to each other through the side plate section 10b, and a space 10d connected to the outside at the other end in the Y-axis direction and both ends in the X-axis direction is formed between the bottom plate section 10a and the top plate section 10c.

Nuts 10e (FIG. 2) constituting a ball screw are provided at a lower surface side of the bottom plate section 10a of the X-axis moving section 10. A screw shaft 12 substantially parallel to the X-axis guide rails 8 is screw engaged with the nuts 10e. An X-axis pulse motor (first motor) 14 is connected to one end side of the screw shaft 12.

Therefore, when the screw shaft 12 is rotated by the X-axis pulse motor 14, the X-axis moving section 10 is moved in the X-axis direction along the X-axis guide rails 8. Note that a position sensor (not illustrated) is provided in the vicinity of the X-axis guide rails 8, and the position in the X-axis direction of the X-axis moving section 10 is detected by the position sensor.

A table (chuck table) 16 configured to be able to support a plate-shaped workpiece 11 (see FIG. 3) is disposed on an upper surface side of the top plate section 10c of the X-axis moving section 10. The table 16 is supported by the top plate section 10c such as to be rotatable around a rotational axis substantially parallel to the Z-axis direction. In other words, the table 16 is supported by the X-axis moving section 10.

Figure 3:
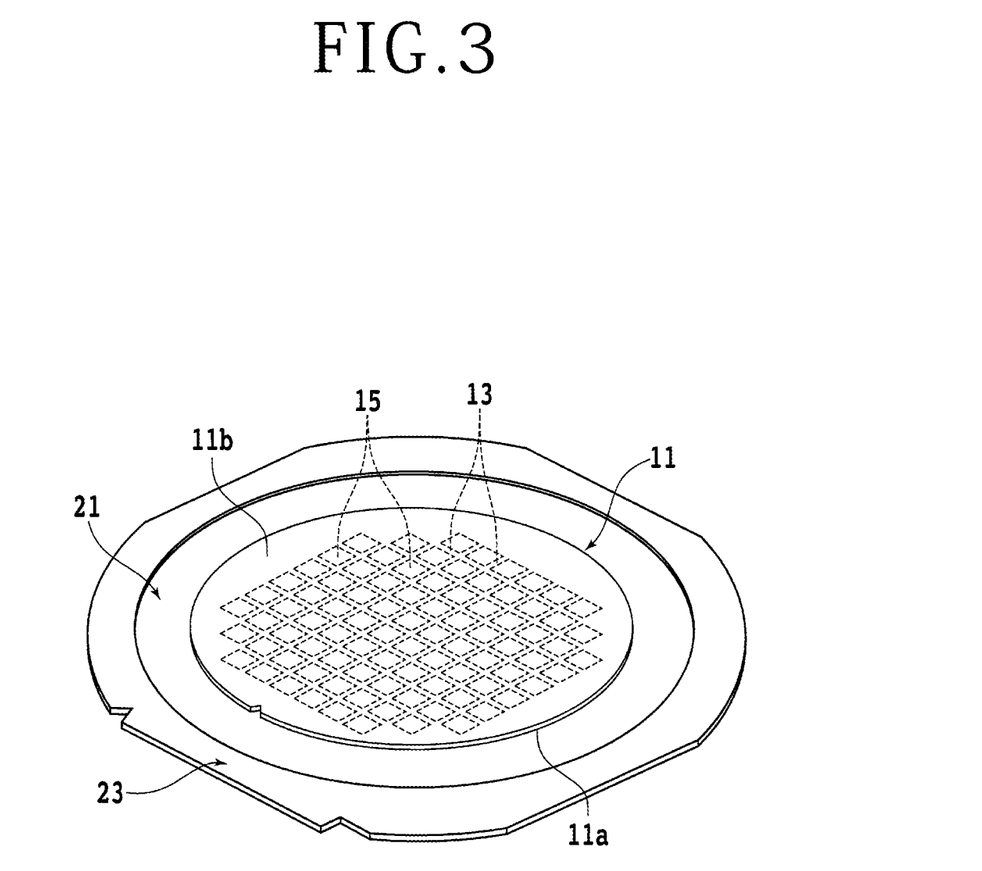

FIG. 3 is a perspective view depicting a configuration example of the workpiece 11 and the like. The workpiece 11 is, for example, a disk-shaped wafer including a semiconductor such as silicon. A front surface 11a (lower surface in FIG. 3) side of the workpiece 11 is partitioned into a plurality of small regions by a plurality of intersecting streets, and a device 15 such as an integrated circuit (IC) is formed in each of the small regions.

For example, a tape (dicing tape) 21 larger in diameter than the workpiece 11 is adhered to the front surface 11a side of the workpiece 11. In addition, a peripheral part of the tape 21 is fixed to an annular frame 23. In this way, the workpiece 11 is processed in a state of being supported by the frame 23 through the tape 21 in such a manner that a back surface 11b on the side opposite to the front surface 11a is exposed.

Note that, while the disk-shaped wafer including a semiconductor such as silicon is used as the workpiece 11 in the present embodiment, the material, shape, structure, size, and the like of the workpiece 11 are not limited. For example, a substrate or the like including other semiconductor, ceramic, resin, metal, or the like may be used as the workpiece 11.

Similarly, the kind, number, shape, structure, size, layout, and the like of the devices 15 formed on the workpiece 11 are not limited. The workpiece 11 may not necessarily be formed with the devices 15. In addition, the workpiece 11 may be processed in a state in which the tape 21 is not adhered thereto or in a state of not being supported by the frame 23.

As depicted in FIG. 2, the table 16 includes a cylindrical frame body 18 formed by use of a metal represented by stainless steel, for example. A lower end side of a space 18a provided inside the frame body 18 is connected to an opening 10f that vertically penetrates the top plate section 10c. A disk-shaped support plate 20 is provided at an upper portion of the frame body 18 such as to close the upper end side of the space 18a.

The support plate 20 has a substantially flat upper surface (first surface) 20a and a lower surface (second surface) 20b on the side opposite to the upper surface 20a, and is formed by use of a material which is transparent to visible light such as, for example, soda glass, borosilicate glass, and quartz glass. The support plate 20 is, at least in a partial region, transparent from the upper surface 20a to the lower surface 20b.

Therefore, the workpiece 11 supported on the upper surface 20a side of the support plate 20 and the like can be observed from the lower surface 20b side of the support plate 20. Note that, while the support plate 20 which is transparent as a whole is depicted as an example in the present embodiment, it is sufficient for the support plate 20 to be transparent from the upper surface 20a to the lower surface 20b in at least a part thereof. In other words, the support plate 20 may not be formed only of a transparent material.

As illustrated in FIG. 1, a cross mark (deviation amount calculation mark) 20c is provided on the upper surface 20a of the transparent region of the support plate 20. It is to be noted, however, it is sufficient that the mark 20c is configured to be distinguishable by visible light from above and below of the support plate 20, and its shape and layout, and the like are not particularly limited. For example, the mark 20c may be provided on the lower surface 20b or the inside of the support plate 20. The function and use method of the mark 20c will be described later.

The frame body 18 is provided therein with a flow channel (not illustrated) for transmitting a negative pressure used for suction of the tape 21 adhered to the workpiece 11. An opening (not illustrated) corresponding to one end of the flow channel is formed at an upper end surface of the frame body 18. A suction source (not illustrated) such as a vacuum pump is connected to the other end side of the flow channel.

A pulley 22 larger in diameter than the frame body 18 is fixed to a peripheral surface of the frame body 18. A rotational drive source 24 such as a motor is provided at the side plate section 10b of the X-axis moving section 10, and a pulley 26 is connected to a rotary shaft of the rotational drive source 24. An endless belt 28 for transmitting the power of the rotational drive source 24 to the table 16 is wrapped around the pulley 22 and the pulley 26.

Therefore, table 16 is rotated around a rotational axis substantially parallel to the Z-axis direction, by a force transmitted from the rotational drive source 24 through the endless belt 28. Note that a plurality of clamps 30 capable of fixing the annular frame 23 are disposed at positions on the outside of the frame body 18. In addition, the table 16 is moved in the X-axis direction (processing feeding) together with the X-axis moving section 10 and the like by the aforementioned X-axis moving mechanism 6.

As depicted in FIG. 1, a first Y-axis moving mechanism (second feeding mechanism, indexing feeding mechanism) 32 of a ball screw type is disposed at a position adjacent to the X-axis moving mechanism 6 in the Y-axis direction. The first Y-axis moving mechanism 32 includes, for example, a pair of Y-axis guide rails 34 fixed to the upper surface of the base 4 and substantially parallel to the Y-axis direction. A Y-axis moving section (second moving section) 36 is attached to the Y-axis guide rails 34 such as to be slidable in the Y-axis direction.

The Y-axis moving section 36 includes a flat plate-shaped first part 36a which is rectangular in shape as viewed from the Z-axis direction. The Y-axis guide rails 34 are in contact with a lower surface of the first part 36a. A lower end of a columnar second part 36b having a side surface substantially perpendicular to the X-axis direction is connected to one end side in the X-axis direction of the first part 36a.

Nuts (not illustrated) constituting a ball screw are provided on the lower surface side of the first part 36a. A screw shaft 38 substantially parallel to the Y-axis guide rails 34 are screw engaged with the nuts in a rotatable manner. A Y-axis pulse motor (second motor) 40 is connected to one end portion of the screw shaft 38.

Therefore, when the screw shaft 38 is rotated by the Y-axis pulse motor 40, the Y-axis moving section 36 is moved in the Y-axis direction along the Y-axis guide rails 34. Note that a position sensor (not illustrated) is provided in the vicinity of the Y-axis guide rails 34, and the position in the Y-axis direction of the Y-axis moving section 36 is detected by the position sensor.

A first Z-axis moving mechanism 42 of a ball screw type is disposed at the second part 36b of the Y-axis moving section 36. The first Z-axis moving mechanism 42 includes a pair of Z-axis guide rails 44 fixed to the side surface (the side surface substantially perpendicular to the X-axis direction) of the second part 36b and substantially parallel to the Z-axis direction. A Z-axis moving section 46 is attached to the Z-axis guide rails 44 such as to be slidable in the Z-axis direction.

Nuts (not illustrated) constituting a ball screw are provided at a side surface on the second part 36b side of the Z-axis moving section 46. A screw shaft (not illustrated) substantially parallel to the Z-axis guide rails 44 is screw engaged with the nuts in a rotatable manner. A Z-axis pulse motor 48 is connected to one end portion of the screw shaft.

Therefore, when the screw shaft is rotated by the Z-axis pulse motor 48, the Z-axis moving section 46 is moved in the Z-axis direction along the Z-axis guide rails 44. Note that a position sensor (not illustrated) is provided in the vicinity of the Z-axis guide rails 44, and the position in the Z-axis direction of the Z-axis moving section 46 is detected by the position sensor.

A cutting unit 50 is supported by the Z-axis moving section 46. In other words, the cutting unit 50 is supported by the Y-axis moving section 36 and the Z-axis moving section 46, is moved in the Y-axis direction (indexing feeding) by the first Y-axis moving mechanism 32, and is moved in the Z-axis direction by the first Z-axis moving mechanism 42. The cutting unit 50 includes a tubular spindle housing 52 fixed to the Z-axis moving section 46. A spindle 54 (see FIG. 8) which is a rotary shaft substantially parallel to the Y-axis direction is accommodated in a space inside the spindle housing 52.

One end portion of the spindle 54 is exposed from the spindle housing 52 to the outside. An annular cutting blade 56 obtained, for example, by fixing abrasive grains of diamond or the like with a binder such as a resin is mounted to the one end portion of the spindle 54. In addition, a rotational drive source (not illustrated) such as a motor is connected to the other end side of the spindle 54.

An upper camera (first camera) 58 capable of imaging the workpiece 11 supported by the table 16 and the like from above is fixed to the spindle housing 52 of the cutting unit 50. In other words, the upper camera 58 is supported by the Y-axis moving section 36 and the Z-axis moving section 46 together with the cutting unit 50, is moved in the Y-axis direction by the first Y-axis moving mechanism 32, and is moved in the Z-axis direction by the first Z-axis moving mechanism 42.

The upper camera 58 includes, for example, a two-dimensional optical sensor such as a complementary metal oxide semiconductor (CMOS) image sensor or a charge coupled device (CCD) image sensor having sensitivity to light of a wavelength in a visible region, and an image-forming lens. It is to be noted, however, that the kind, structure, and the like of the upper camera 58 are not particularly limited.

Figure 4:
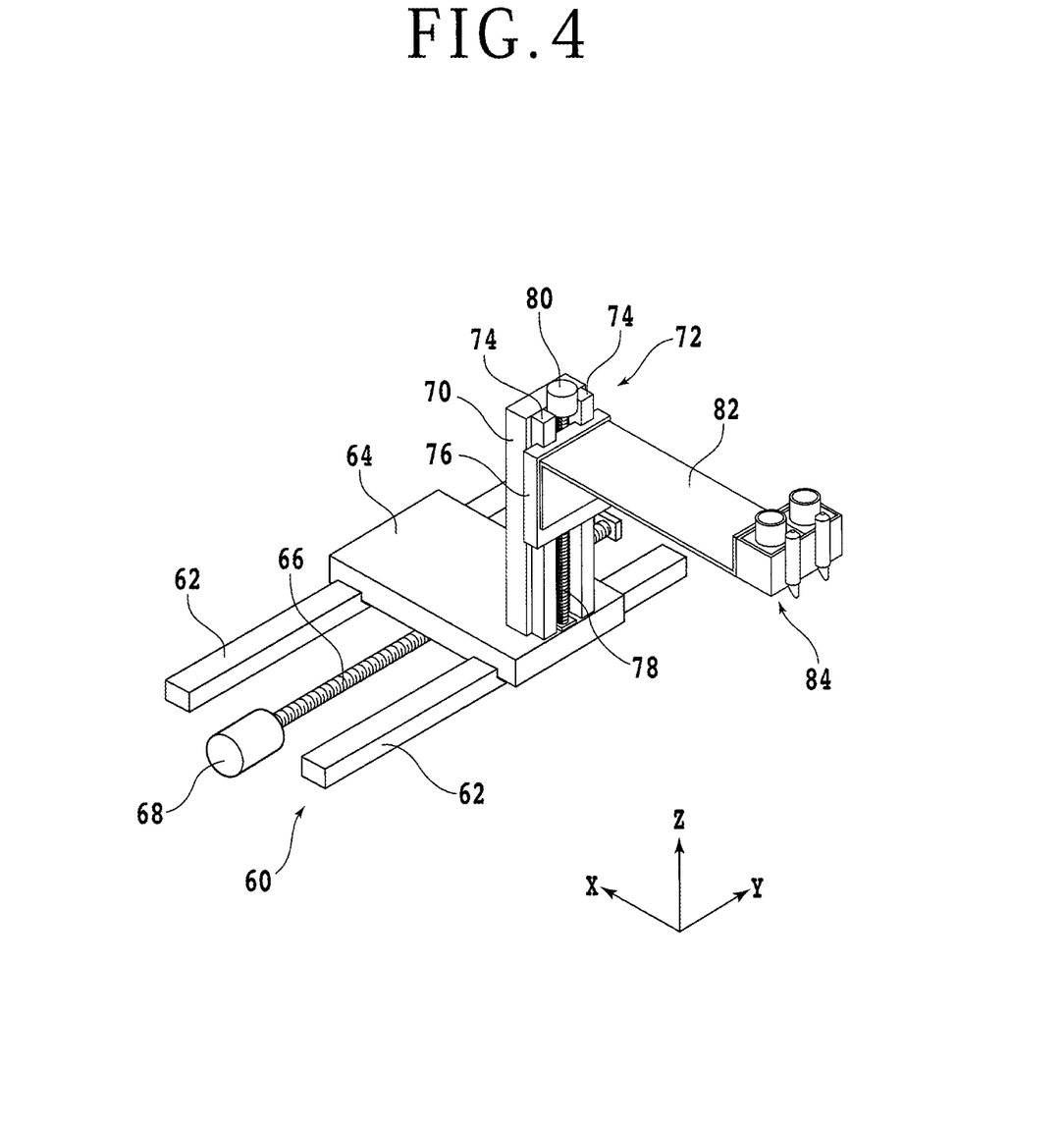
FIG. 4 is a perspective view depicting a part of the cutting apparatus.

As illustrated in FIG. 1, a second Y-axis moving mechanism (third feeding mechanism) 60 of a ball screw type is disposed at a position adjacent to the X-axis moving mechanism 6 in the X-axis direction. FIG. 4 is a perspective view depicting the second Y-axis moving mechanism 60. As depicted in FIGS. 1 and 4, the second Y-axis moving mechanism 60 includes, for example, a pair of Y-axis guide rails 62 fixed to an upper surface of the base 4 and substantially parallel to the Y-axis direction. A flat plate-shaped Y-axis moving section (third moving section) 64 is attached to the Y-axis guide rails 62 such as to be slidable in the Y-axis direction.

Nuts (not illustrated) constituting a ball screw are provided on a lower surface side of the Y-axis moving section 64. A screw shaft 66 substantially parallel to the Y-axis guide rails 62 is screw engaged with the nuts in a rotatable manner. A Y-axis pulse motor (third motor) 68 is connected to one end portion of the screw shaft 66.

Therefore, when the screw shaft 66 is rotated by the Y-axis pulse motor 68, the Y-axis moving section 64 is moved in the Y-axis direction along the Y-axis guide rails 62. Note that a position sensor (not illustrated) is provided in the vicinity of the Y-axis guide rails 62, and the position in the Y-axis direction of the Y-axis moving section 64 is detected by the position sensor.

A support section 70 having a side surface substantially perpendicular to the X-axis direction is fixed to an upper surface of the Y-axis moving section 64. A second Z-axis moving mechanism 72 of a ball screw type is disposed on the support section 70. The second Z-axis moving mechanism 72 includes a pair of Z-axis guide rails 74 fixed to the side surface (the side surface substantially perpendicular to the X-axis direction) of the support section 70 and substantially parallel to the Z-axis direction. A Z-axis moving section 76 is attached to the Z-axis guide rails 74 such as to be slidable in the Z-axis direction.

Nuts (not illustrated) constituting a ball screw are provided at a side surface on the support section 70 side of the Z-axis moving section 76. A screw shaft 78 substantially parallel to the Z-axis guide rails 74 is screw engaged with the nuts in a rotatable manner. A Z-axis pulse motor 80 is connected to one end portion of the screw shaft 78.

Therefore, when the screw shaft 78 is rotated by the Z-axis pulse motor 80, the Z-axis moving section 76 is moved in the Z-axis direction along the Z-axis guide rails 74. Note that a position sensor (not illustrated) is provided in the vicinity of the Z-axis guide rails 74, and the position in the Z-axis direction of the Z-axis moving section 76 is detected by the position sensor.

An arm 82 projecting to the X-axis moving mechanism 6 side is fixed to the Z-axis moving section 76. A lower camera (second camera) 84 capable of imaging the workpiece 11 supported by the table 16 and the like from below is fixed to a tip end portion of the arm 82. In other words, the lower camera 84 is supported by the Y-axis moving section 64 and the Z-axis moving section 76, is moved in the Y-axis direction by the second Y-axis moving mechanism 60, and is moved in the Z-axis direction by the second Z-axis moving mechanism 72.

Like the upper camera 58, the lower camera 84 includes, for example, a two-dimensional optical sensor such as a complementary metal oxide semiconductor (CMOS) image sensor or a charge coupled device (CCD) image sensor having sensitivity of a wavelength in a visible region, and an image forming lens. It is to be noted, however, that the kind, structure, and the like of the lower camera 84 are not particularly limited. The kind, structure, and the like of the lower camera 84 may be the same as, or may be different from, the kind, structure, and the like of the upper camera 58.

An upper portion of the base 4 is covered by a cover (not illustrated) capable of accommodating the components. A touch screen (input-output device) (not illustrated) serving as a user interface is disposed at a side surface of the cover.

For example, various conditions applied when processing the workpiece 11 are inputted to the touch screen.

In addition, for example, images obtained by imaging of the workpiece 11 and the like by the upper camera 58 and the lower camera 84 are displayed on the touch screen. Note that, in place of the touch screen in which a display device (output device) and an input device are integrated, a display device (output device) such as a liquid crystal display and an input device such as a keyboard and a mouse may be provided.

The components such as the X-axis moving mechanism 6 (X-axis pulse motor 14), the rotational drive source 24, the first Y-axis moving mechanism 32 (Y-axis pulse motor 40), the first Z-axis moving mechanism 42 (Z-axis pulse motor 48), the cutting unit 50, the upper camera 58, the second Y-axis moving mechanism 60 (Y-axis pulse motor 68), the second Z-axis moving mechanism 72 (Z-axis pulse motor 80), the lower camera 84, and the touch screen are each connected to a control unit 86. The control unit 86 controls each of the aforementioned components according to a series of steps necessary for processing the workpiece 11.

The control unit 86 includes, for example, a computer including a processing device such as a central processing unit (CPU), a main storage device such as a dynamic random access memory (DRAM), and an auxiliary storage device such as a hard disk drive and a flash memory. By operating the processing device and the like according to software stored in the auxiliary storage device, the functions of the control unit 86 can be realized. It is to be noted, however, that the control unit 86 may be realized by only hardware.

Figure 5:
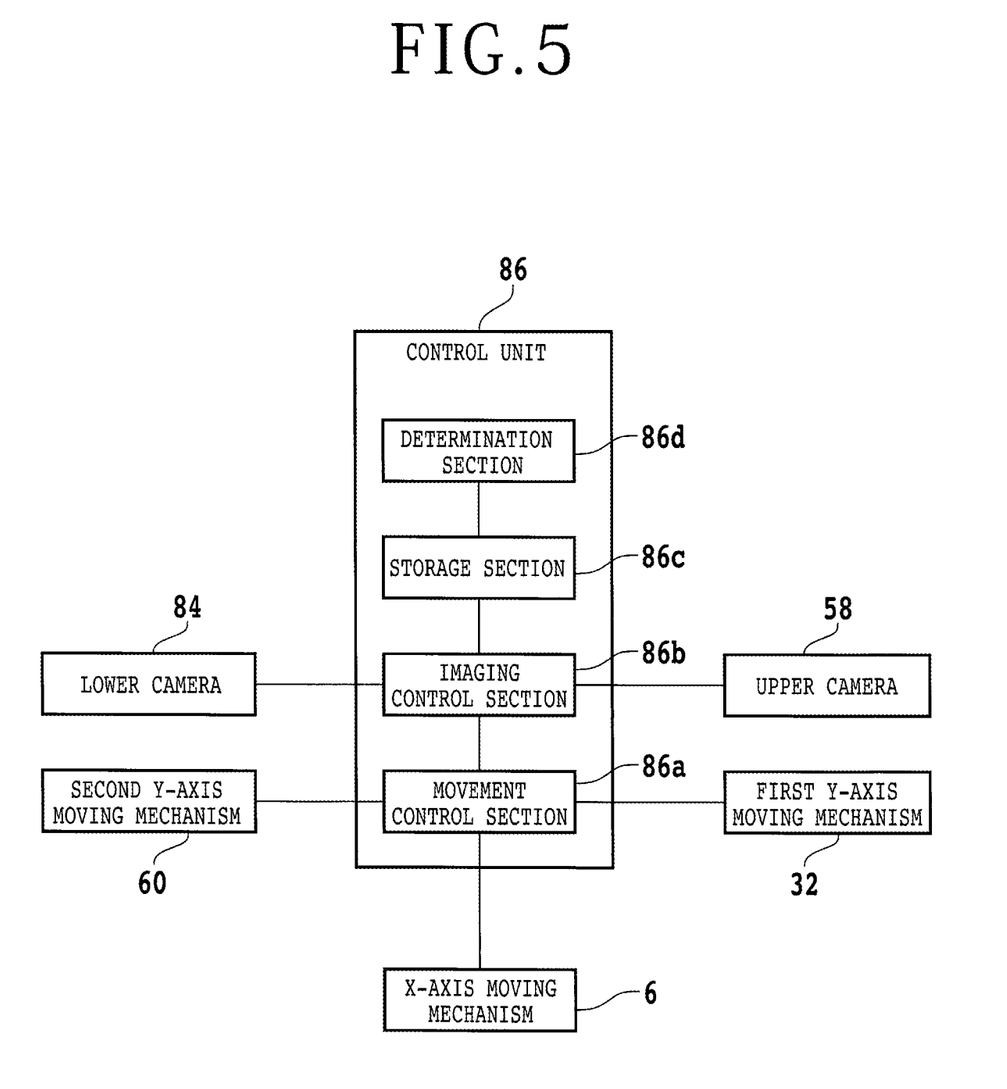
FIG. 5 is a functional block diagram depicting the functional structure of a control unit.

FIG. 5 is a functional block diagram depicting the functional structure of the control unit 86. As illustrated in FIG. 5, the control unit 86 includes a movement control section 86a that controls operations of the X-axis moving mechanism 6 (X-axis pulse motor 14), the first Y-axis moving mechanism 32 (Y-axis pulse motor 40), the second Y-axis moving mechanism 60 (Y-axis pulse motor 68), and the like, and an imaging control section 86b that controls operations of the upper camera 58 and the lower camera 84.

In order to check a defect, what is called an oblique cut, in which the position of the upper end of a kerf formed in the workpiece 11 and the position of the lower end of the kerf are deviated from each other, deviations in position (deviations in position in the X-axis direction and the Y-axis direction) between a region imaged by the upper camera 58 at a reference position (hereinafter referred to as first imaging region) and a region imaged by the lower camera 84 at a reference position (hereinafter referred to as second imaging region) are preliminarily confirmed.

Specifically, for example, the movement control section 86a, by controlling the operation of the X-axis moving mechanism 6 (X-axis pulse motor 14), positions the table 16 at a position serving as a reference in the X-axis direction when imaging by the upper camera 58. In addition, the movement control section 86a, by controlling the operation of the first Y-axis moving mechanism 32 (Y-axis pulse motor 40), positions the upper camera 58 at a position serving as a reference in the Y-axis direction when imaging by the upper camera 58. As a result, the mark 20c provided on the upper surface 20a of the support plate 20 is positioned in the first imaging region.

Figure 6A:
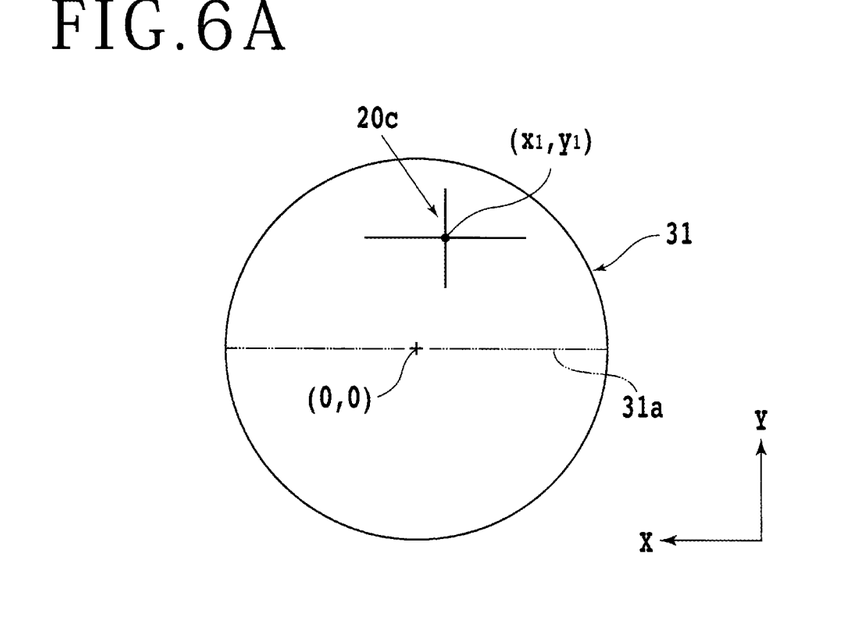
FIG. 6A is an example of an image obtained by imaging a mark from above.

Next, the imaging control section 86b controls the operation of the upper camera 58, to image the upper surface 20a of the support plate 20 from above by the upper camera 58. Thus, an image including the mark 20c can be acquired. FIG. 6A is an example of an image 31 obtained by imaging the mark 20c from above. In the image 31, a reference line 31a substantially parallel to the X-axis direction is also depicted.

In the example illustrated in FIG. 6A, the coordinates (0, 0) in the center of the image 31 obtained at a position serving as a reference is deviated from the coordinates ($x_1$, $y_1$) corresponding to the mark 20c. Therefore, for positioning the mark 20c at the center of the first imaging region, it is necessary to shift the position of the table 16 by $-x_1$ from the reference position in the X-axis direction, and to shift the position of the upper camera 58 by $-y_1$ from the reference position. The deviation amounts calculated in this way (namely, the amounts corresponding to the coordinates ($x_1$, $y_1$) of the mark 20c) are stored in the storage section 86c of the control unit 86 as the deviation amounts of the upper camera 58.

Similarly, the movement control section 86a, by controlling the operation of the X-axis moving mechanism 6 (X-axis pulse motor 14), positions the table 16 at a position serving as a reference in the X-axis direction when imaging by the lower camera 84. In addition, the movement control section 86a, by controlling the operation of the second Y-axis moving mechanism 60 (Y-axis pulse motor 68), positions the lower camera 84 at a position serving as a reference in the Y-axis direction when imaging by the lower camera 84. As a result, the mark 20c provided on the upper surface 20a of the support plate 20 is positioned in the second imaging region.

Figure 6B:
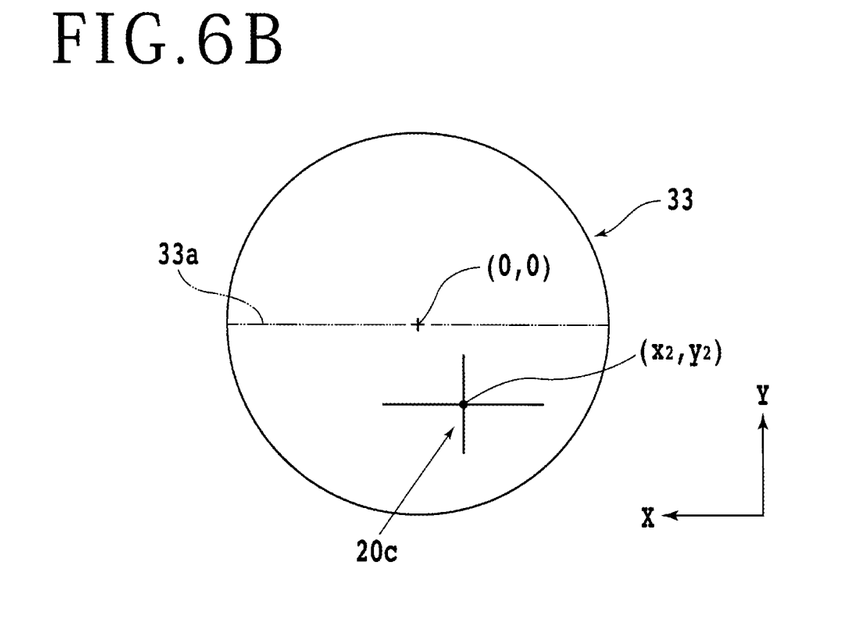
FIG. 6B is an example of an image obtained by imaging the mark from below.

Next, the imaging control section 86b controls the operation of the lower camera 84, to image the upper surface 20a of the support plate 20 from below by the lower camera 84. Thus, an image including the mark 20c can be acquired. FIG. 6B is an example of an image 33 obtained by imaging the mark 20c from below. In the image 33, a reference line 33a substantially parallel to the X-axis direction is also depicted.

Note that, by the lower camera 84, an image as a mirror image with respect to the image obtained by imaging from above is acquired. In view of this, for easy comparison with the image 31 acquired by the upper camera 58, in the present embodiment, an image 33 obtained by inverting the image acquired by the lower camera 84 into a mirror image is depicted.

In the example depicted in FIG. 6B, also, the coordinates (0, 0) of the center of the image 33 obtained at the position serving as a reference are deviated from the coordinates ($x_2$, $y_2$) corresponding to the mark 20c. Therefore, for positioning the mark 20c at the center of the second imaging region, it is necessary to shift the position of the table 16 by $-x_2$ from the reference position in the X-axis direction, and to shift the position of the lower camera 84 by $-y_2$ from the reference position. The deviation amounts calculated in this way (namely, the amounts corresponding to the coordinates (x2, y2) of the mark 20c) are stored in the storage section 86c of the control unit 86 as deviation amounts of the lower camera 84.

The sum of the deviation amounts of the upper camera 58 and the deviation amounts of the lower camera 84 corresponds to the deviation amounts between the first imaging region (namely, the imaging region at the reference position of the upper camera 58) and the second imaging region (namely, the imaging region at the reference position of the lower camera 84). Therefore, by using the deviation amount of the upper camera 58 and the deviation amounts of the lower camera 84, it is possible to superimpose the imaging region of the upper camera 58 (the region imaged by the upper camera 58) and the imaging region of the lower camera 84 (the region imaged by the lower camera 84), and thereby to substantially eliminate these deviation.

For example, when one of the position of the imaging region of the upper camera 58 and the position of the imaging region of the lower camera 84 is not corrected, and the other of the position of the imaging region of the upper camera 58 and the position of the imaging region of the lower camera 84 is corrected on the basis of the deviation amounts of the upper camera 58 and the deviation amounts of the lower camera 84, it is thereby possible to superimpose the imaging region of the upper camera 58 and the imaging region of the lower camera 84.

In addition, for example, in the case where the position of the imaging region of the upper camera 58 is corrected on the basis of the deviation amounts of the upper camera 58, and the position of the imaging region of the lower camera 84 is corrected on the basis of the deviation amounts of the lower camera 84, also, the imaging region of the upper camera 58, and the imaging region of the lower camera 84 can be superimposed similarly. It is to be noted, however, that a specific processing method for superimposing the imaging region of the upper camera 58 and the imaging region of the lower camera 84 is not limited.

In actually confirming the presence or absence of an oblique cut, the positional relation between the upper camera 58 or the lower camera 84 and the table 16 is adjusted, on the basis of the deviation amounts of the upper camera 58 and the deviation amounts of the lower camera 84 which are stored in the storage section 86c. Then, the kerf formed in the workpiece 11 is imaged from above by the upper camera 58, and the kerf formed in the workpiece 11 is imaged from below by the lower camera 84. A determination section 86d of the control unit 86 compares the positions of the kerfs appearing in the two images, to thereby determine whether or not the oblique cut has been generated.

Figure 7:
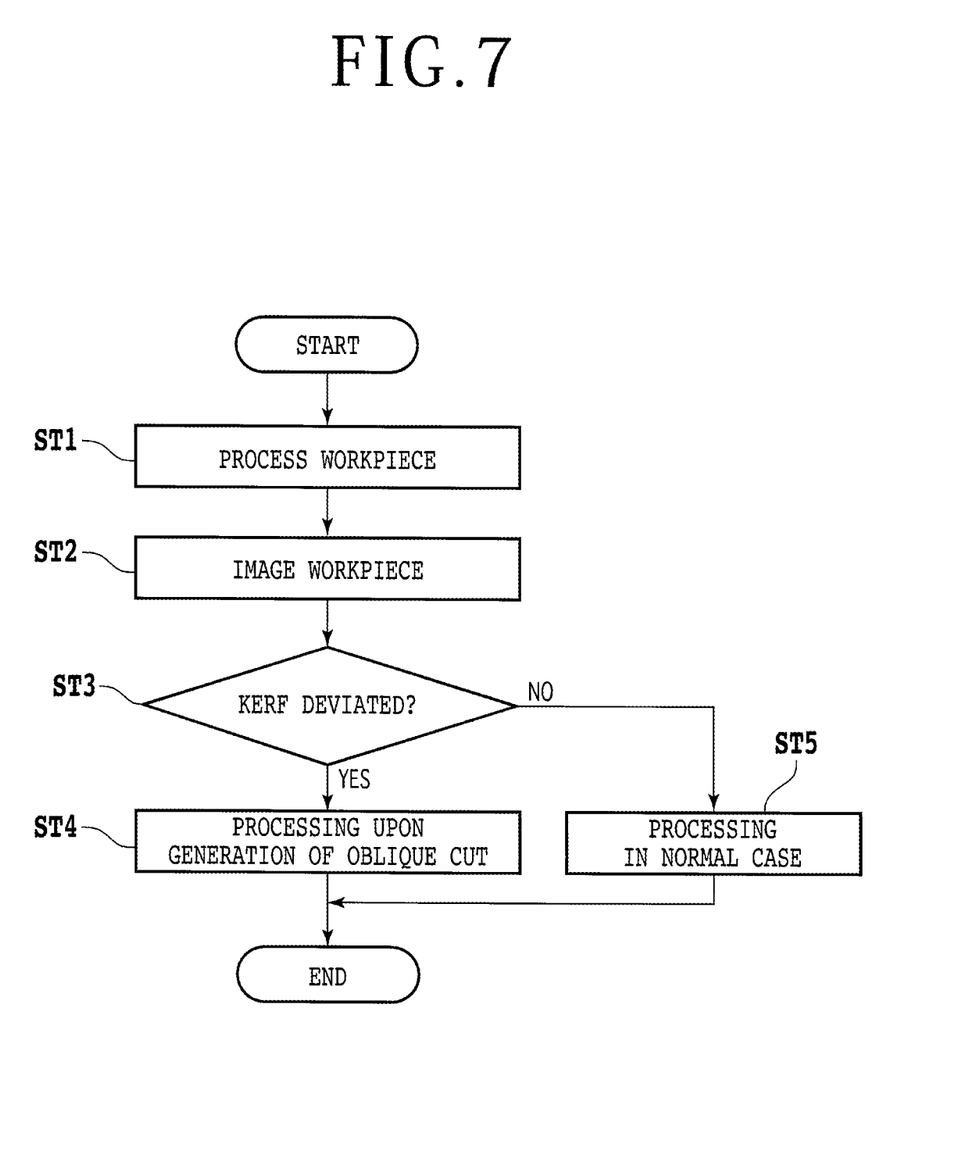
FIG. 7 is a flow chart depicting an outline of a method for confirming the presence or absence of an oblique cut.
Figure 8:
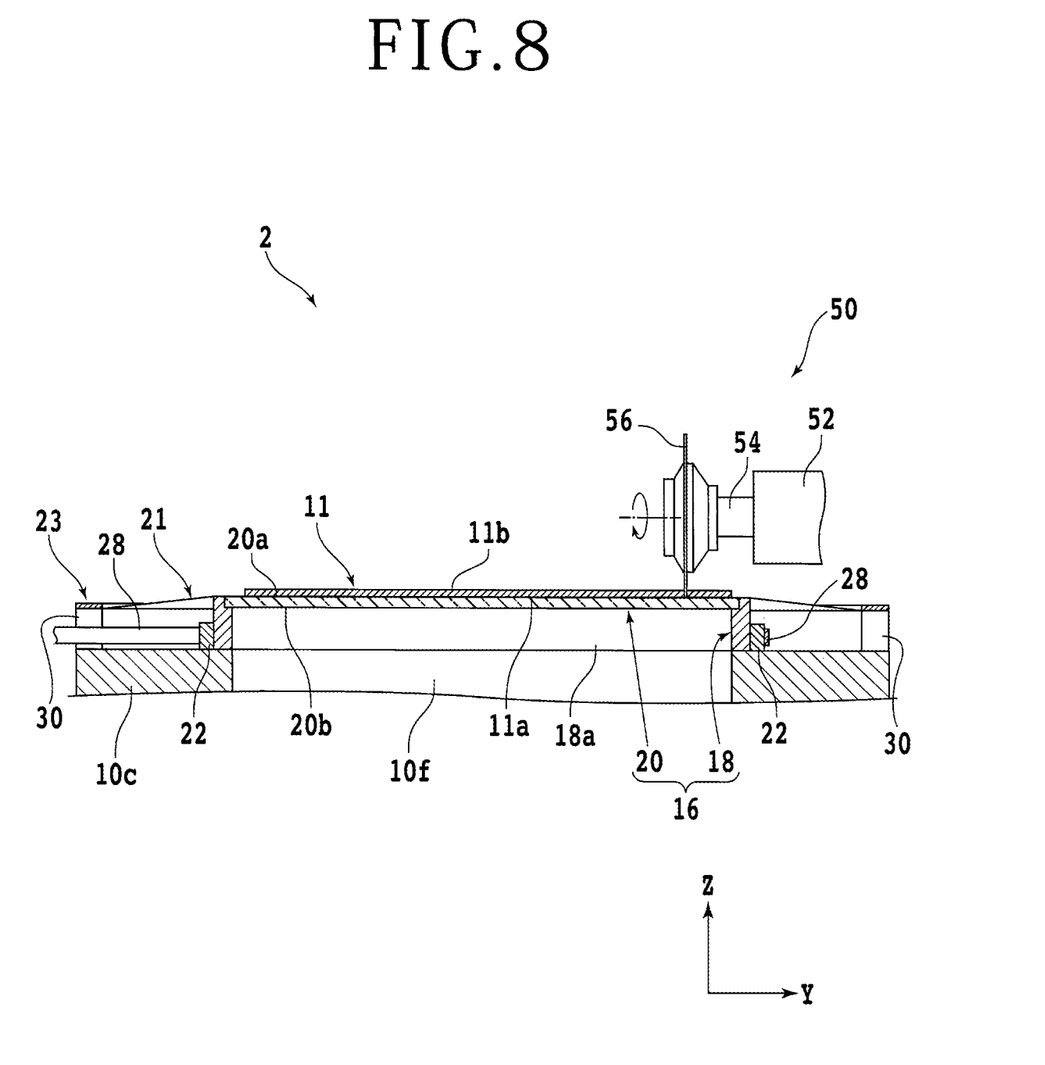
FIG. 8 is a sectional view depicting a manner in which the workpiece is processed.

FIG. 7 is a flow chart depicting an outline of the method for confirming the presence or absence of an oblique cut. First, the workpiece 11 is processed at a given street 13 (processing step ST1). FIG. 8 is a sectional view depicting the manner in which the workpiece 11 is processed. Specifically, in a state in which the lower end of the cutting blade 56 is positioned below the lower surface (in the present embodiment, the front surface 11a) of the workpiece 11, the cutting blade 56 is rotated to cause the cutting blade 56 to cut into the street 13 of the workpiece 11. Thus, a kerf for cutting the workpiece 11 along the street 13 is formed.

Figure 9:
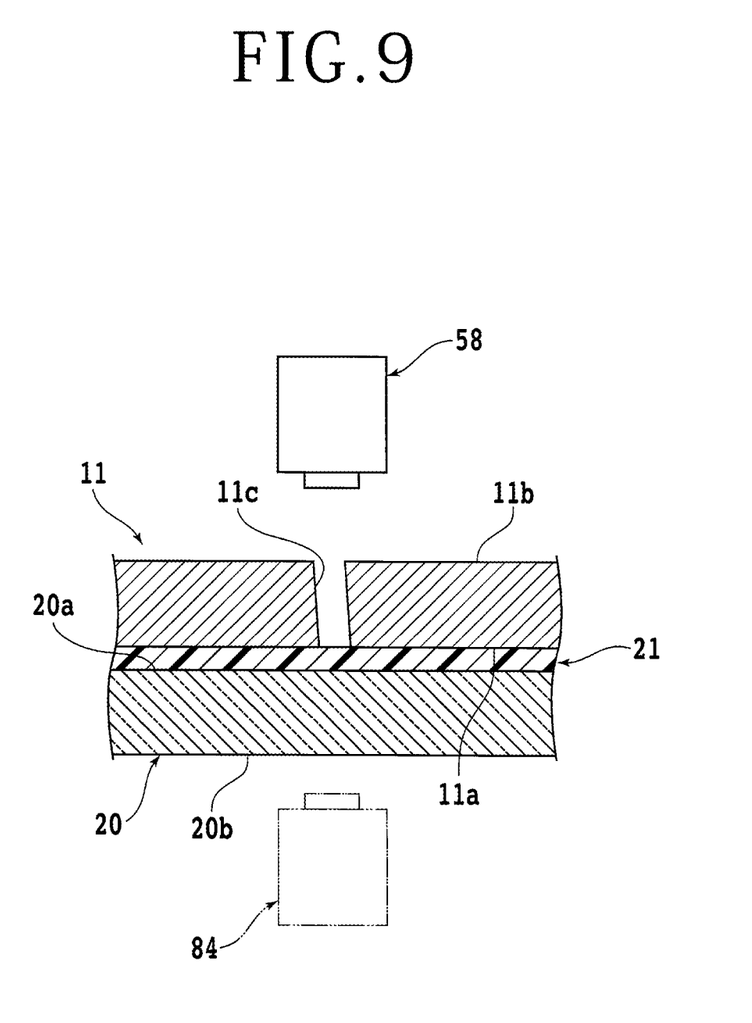
FIG. 9 is a sectional view depicting a manner in which a kerf in the workpiece is imaged.
Figure 10A:
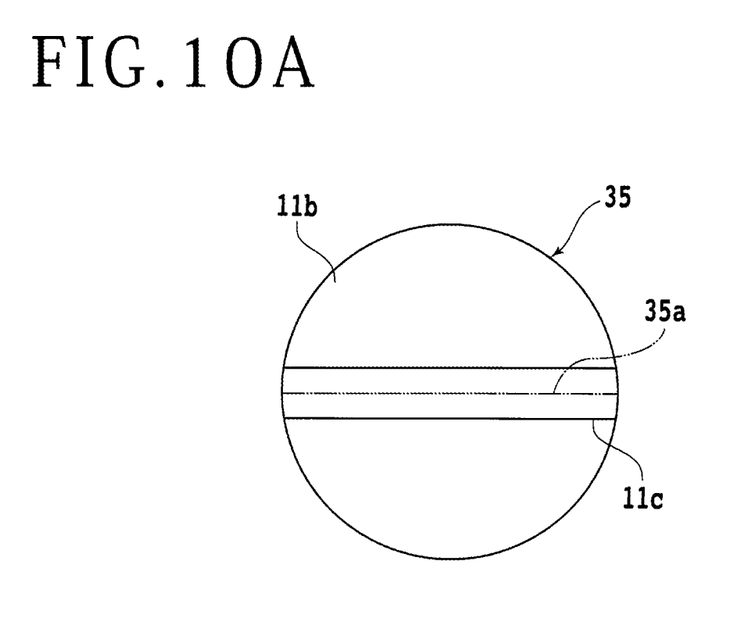
FIG. 10A is an example of an image obtained by imaging the workpiece from above.

Thereafter, the workpiece 11 is imaged to acquire an image in which the kerf is appearing (imaging step ST2). FIG. 9 is a sectional view depicting a manner in which the kerf 11c in the workpiece 11 is imaged. For example, the upper camera 58 is positioned directly above the kerf 11c, and the workpiece 11 is imaged from above by the upper camera 58. Thus, an image in which the kerf 11c is appearing can be acquired. FIG. 10A is an example of an image 35 obtained by imaging the workpiece 11 from above. The acquired image 35 is, for example, stored in the storage section 86c of the control unit 86.

Figure 10B:
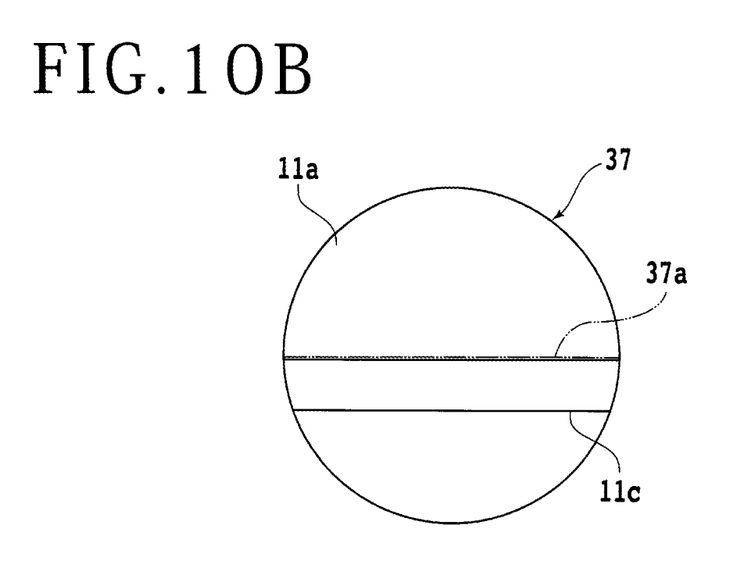
FIG. 10B is an example of an image obtained by imaging the workpiece from below.

Next, on the basis of the deviation amounts of the upper camera 58 and the deviation amounts of the lower camera 84 which are stored in the storage section 86c, the positional relation between the lower camera 84 and the table 16 is adjusted such that the imaging region of the lower camera 84 is superimposed on the imaging region of the upper camera 58. Then, the workpiece 11 is imaged from below by the lower camera 84. Thus, an image in which the kerf 11c appears can be acquired. FIG. 10B is an example of an image 37 obtained by imaging the workpiece 11 from below.

The acquired image 37 is, for example, stored in the storage section 86c of the control unit 86.

After the aforementioned image 35 and image 37 are acquired, the determination section 86d of the control unit 86 determines the presence or absence of an oblique cut (determination step ST3). In the present embodiment, as aforementioned, the imaging region of the upper camera 58 and the imaging region of the lower camera 84 are substantially superimposed, by use of the deviation amounts of the upper camera 58 and the deviation amounts of the lower camera 84. Therefore, the position of the reference line 35a in the image 35 and the position of the reference line 37a in the image 37 are substantially coincident.

Therefore, the presence or absence of an oblique cut can be confirmed, by only comparing the positional relation between the kerf 11c (upper end) appearing in the image 35 and the reference line 35a and the positional relation between the kerf 11c (lower end) appearing in the image 37 and the reference line 37a. Note that in the present embodiment, since the image 35 is acquired by positioning the upper camera 58 directly above the kerf 11c, there is no deviation between the position of the kerf 11c (upper end) appearing in the image 35 and the position of the reference line 35a. Therefore, the determination section 86d calculates the deviation between the position of the kerf 11c (lower end) appearing in the image 37 and the reference line 37a.

In the case where the calculated positional deviation is greater than a predetermined threshold (or where the calculated positional deviation is equal to or greater than the threshold), or in the case where the deviation between the position of the upper end of the kerf 11c and the position of the lower end of the kerf 11c is large (determination step ST3: YES), a processing at the time when an oblique cut is generated is conducted (abnormal case processing step ST4). For example, the determination section 86d displays on a touch screen that an oblique cut has been generated. In addition, the operator performs a maintenance work such as inspection and exchange of the cutting blade 56 or the like.

On the other hand, in the case where the calculated positional deviation is equal to or smaller than a predetermined threshold (or where the calculated positional deviation is smaller than the threshold), or in the case where the deviation between the position of the upper end of the kerf 11c and the position of the lower end of the kerf 11c is small (determination step ST3: NO), a processing at a normal time when an oblique cut is not generated is conducted (normal case processing step ST5). For example, the determination section 56d displays on the touch screen that an oblique cut has not been generated.

As described above, the cutting apparatus 2 according to the present embodiment includes the storage section 86c that stores the deviation amounts of the upper camera 58 and the deviation amounts of the lower camera 84 corresponding to the positional deviation amounts in the X-axis direction and the Y-axis direction between the region (first imaging region) imaged at a reference position of the upper camera (first camera) 58 and the region (second imaging region) imaged by the lower camera (second camera) 84. Therefore, by adjusting the positional relation between the upper camera 58 or the lower camera 84 and the table 16 on the basis of the deviation amounts recorded in the storage section 86c, the region imaged by one of the upper camera 58 and the lower camera 84 can be securely imaged by the other of the upper camera 58 and the lower camera 84. Accordingly, an oblique cut can be properly found.

Note that the present invention can be carried out with various modifications, without being limited by the description of the above embodiment. For example, while the cutting apparatus 2 in which the upper camera (first camera) 58 is supported by the Y-axis moving section (second moving section) 36 of the Y-axis moving mechanism (second feeding mechanism, indexing feeding mechanism) 32 whereas the lower camera (second camera) 84 is supported by the Y-axis moving section (third moving section) 64 of the second Y-axis moving mechanism (third feeding mechanism) 60 has been depicted as an example in the aforementioned embodiment, other configuration may be adopted for the cutting apparatus of the present invention.

For example, both of the upper camera (first camera) 58 and the lower camera (second camera) 84 may be supported by the Y-axis moving section (second moving section) 36 of the first Y-axis moving mechanism (second feeding mechanism, indexing feeding mechanism) 32. In this case, it is difficult to independently move the upper camera 58 and the lower camera 84, but, on the other hand, the second Y-axis moving mechanism (third feeding mechanism) 60 can be omitted.

In addition, in the aforementioned embodiment, the deviation amounts are calculated on the basis of the image 31 obtained by imaging the region including the mark 20c by the upper camera (first camera) 58 and the image 33 obtained by imaging the region including the mark 20c by the lower camera (second camera) 84, while using the mark 20c (deviation amount calculation mark) provided on the support plate 20 of the table 16; however, the deviation amounts may be preliminarily calculated by other method.

Other than the above, the structure, the method, and the like concerning the aforementioned embodiment and modifications and the like can be appropriately modified insofar as the modifications do not depart from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting apparatus comprising:
   a table that includes a support plate transparent in a visible region and supports a plate-shaped workpiece by the support plate;
   a cutting unit that includes a spindle for mounting an annular blade thereto and cuts the workpiece supported by the table;
   a first feeding mechanism that includes a first moving section for supporting the table and a first motor for moving the first moving section in an X-axis direction;
   a second feeding mechanism that includes a second moving section for supporting the cutting unit and a second motor for moving the second moving section in a Y-axis direction;
   a first camera that is disposed on a side of a first surface supporting the workpiece of the support plate;
   a second camera that is disposed on a side of a second surface opposite to the first surface of the support plate; and
   a storage section that stores positional deviation amounts in the X-axis direction and the Y-axis direction between an imaging region at a reference position of the first camera and an imaging region at a reference position of the second camera,
   wherein a positional relation between the first camera or the second camera and the table is adjusted on a basis of the deviation amounts recorded in the storage section, whereby a region imaged by one of the first camera and the second camera is capable of being imaged by the other of the first camera and the second camera.

2. The cutting apparatus according to claim 1,
wherein the table is provided with a deviation amount calculation mark to be used for calculating the deviation amounts, and
the deviation amounts calculated on a basis of an image obtained by imaging a region including the deviation amount calculation mark by the first camera and an image obtained by imaging a region including the deviation amount calculation mark by the second camera are stored in the storage section.

3. The cutting apparatus according to claim 1, further comprising:
a third feeding mechanism that includes a third moving section and a third motor for moving the third moving section in the Y-axis direction,
wherein the first camera is supported by the second moving section, and
the second camera is supported by the third moving section.

4. The cutting apparatus according to claim 1, wherein the first camera and the second camera are supported by the second moving section.

5. The cutting apparatus according to claim 2, further comprising:
a third feeding mechanism that includes a third moving section and a third motor for moving the third moving section in the Y-axis direction,
wherein the first camera is supported by the second moving section, and
the second camera is supported by the third moving section.

6. The cutting apparatus according to claim 2, wherein the first camera and the second camera are supported by the second moving section.

* * * * *